United States Patent
Ren et al.

(10) Patent No.: US 10,930,711 B2
(45) Date of Patent: Feb. 23, 2021

(54) ARRAY SUBSTRATE AND METHOD FOR MANUFACTURING THE SAME, DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Jun Ren, Beijing (CN); Xiao Fu, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 16/195,332

(22) Filed: Nov. 19, 2018

(65) Prior Publication Data
US 2019/0206948 A1    Jul. 4, 2019

(30) Foreign Application Priority Data

Jan. 2, 2018   (CN) .......................... 201810003467

(51) Int. Cl.
*H01L 27/32*   (2006.01)
*H01L 51/50*   (2006.01)
(Continued)

(52) U.S. Cl.
CPC ...... *H01L 27/3213* (2013.01); *H01L 27/3206* (2013.01); *H01L 51/5016* (2013.01);
(Continued)

(58) Field of Classification Search
CPC .............. H01L 51/5036; H01L 51/504; H01L 51/5044; H01L 27/3213; H01L 27/3211;
(Continued)

(56) References Cited

U.S. PATENT DOCUMENTS

2007/0278940 A1* 12/2007 Nshikawa ........... H01L 27/3211
                                                            313/504
2017/0104039 A1   4/2017 Yang et al.
(Continued)

FOREIGN PATENT DOCUMENTS

CN        101083275 A     12/2007
CN        104882465 A      9/2015

OTHER PUBLICATIONS

First Office Action issued in corresponding Chinese Application No. 201810003467.X dated Feb. 6, 2020, with English language translation.

*Primary Examiner* — Thanhha S Pham
(74) *Attorney, Agent, or Firm* — McDermott Will & Emery LLP

(57) ABSTRACT

An array substrate includes a plurality of pixels. Each pixel includes a plurality of sub-pixels. Each sub-pixel includes a light-emitting unit, and a light-emitting unit of each of at least one of the plurality of sub-pixel is formed of a combination of light-emitting materials that are used for forming the light-emitting units of another two of the plurality of sub-pixels respectively.

12 Claims, 14 Drawing Sheets

(51) Int. Cl.
*H01L 51/56* (2006.01)
*H01L 51/52* (2006.01)
*H01L 51/00* (2006.01)

(52) U.S. Cl.
CPC ...... *H01L 51/5056* (2013.01); *H01L 51/5265* (2013.01); *H01L 51/56* (2013.01); *H01L 51/0085* (2013.01); *H01L 2251/558* (2013.01)

(58) Field of Classification Search
CPC ............ H01L 51/5012; H01L 51/5056; H01L 51/5064; H05B 33/145
See application file for complete search history.

(56) References Cited

U.S. PATENT DOCUMENTS

2018/0358417 A1* 12/2018 Hamada .............. H01L 51/5072
2019/0115398 A1* 4/2019 Tsukamoto ......... H01L 51/5265

* cited by examiner

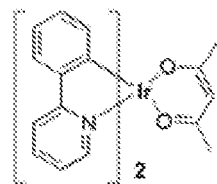

Fig. 8(e)

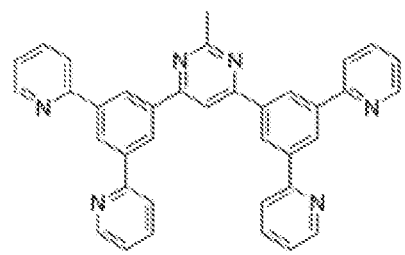

Fig. 8(f)

| | Anode | Hole injection unit | Hole transport unit | Red light-emitting unit | | Green light-emitting unit | | electron transport unit | electron injection unit | cathode |
|---|---|---|---|---|---|---|---|---|---|---|
| material | ITO/Ag/ITO | HATCN | TCTA | CBP | Ir(piq)₃ | TCTA | Ir(ppy)₂(acac) | B3PYMPM | B3PYMPM | LiF | Mg/Ag |
| First thickness combination | 1000Å | 50Å | 300Å | 90Å | 10Å | 70Å | 30Å | 200Å | 350Å | 10Å | 180Å |
| Second thickness combination | 1000Å | 50Å | 350Å | 90Å | 10Å | 70Å | 30Å | 200Å | 350Å | 10Å | 180Å |

Fig. 9(a)

| | Voltage(V) | Efficiency(cd/A) | Chromaticity coordinate(x, y) |
|---|---|---|---|
| First thickness combination | 4.78 | 23.7 | (0.484, 0.487) |
| Second thickness combination | 4.92 | 18.8 | (0.453, 0.516) |

Fig. 9(b)

ARRAY SUBSTRATE AND METHOD FOR MANUFACTURING THE SAME, DISPLAY DEVICE

CROSS-REFERENCE TO RELATED APPLICATION

This application claims priority to Chinese Patent Application No. 201810003467.X, filed on Jan. 2, 2018, titled "AN ARRAY SUBSTRATE AND METHOD FOR MANUFACTURING THE SAME, DISPLAY DEVICE", which is incorporated herein by reference in its entirety.

TECHNICAL FIELD

The present disclosure relates to the field of display technologies, and in particular, to an array substrate and a method for manufacturing the same, and a display device.

BACKGROUND

Organic Light-Emitting Diode (OLED) display devices have attracted wide attention due to their advantages of lightness and thinness, low power consumption, high response, and high resolution.

The OLED display device includes a plurality of pixels, and each of the pixels includes a plurality of sub-pixels. At present, a pixel that is composed of a red sub-pixel, a green sub-pixel, and a blue sub-pixel is widely used.

SUMMARY

In an aspect, an array substrate is provided. The array substrate includes a plurality of pixels. Each pixel includes a plurality of sub-pixels. Each sub-pixel includes a light-emitting unit, and a light-emitting unit of each of at least one of the plurality of sub-pixel is formed of a combination of light-emitting materials that are used for forming light-emitting units of another two of the plurality of sub-pixels.

In some embodiments, the plurality of sub-pixels include a first sub-pixel, a second sub-pixel, a third sub-pixel and a fourth sub-pixel. The first sub-pixel includes a first electroluminescent device, and the first electroluminescent device includes a first color light-emitting unit. The second sub-pixel includes a second electroluminescent device, and the second electroluminescent device includes a second color light-emitting unit. The third sub-pixel includes a third electroluminescent device, and the third electroluminescent device includes a third color light-emitting unit. The fourth sub-pixel includes a fourth electroluminescent device, and a light-emitting unit of the fourth electroluminescent device is formed of a combination of light-emitting materials that are used for forming the second color light-emitting unit and the third color light-emitting unit, respectively.

In some embodiments, the fourth electroluminescent device includes the second color light-emitting unit and third color light-emitting unit that are stacked one on another.

In some embodiments, the first color light-emitting unit is configured to emit light of a blue color, the second color light-emitting unit is configured to emit light of a red color, and the third color light-emitting unit is configured to emit light of a green color.

In some embodiments, the first sub-pixel, the second sub-pixel, the third sub-pixel, and the fourth sub-pixel are arranged in a 2×2 array. Among four sub-pixels that are composed of the first sub-pixel, the second sub-pixel, the third sub-pixel, and the fourth sub-pixel, any two sub-pixels are adjacently disposed in an i-th row, and another two sub-pixels are adjacently disposed in an i+1th row, where i is a positive integer.

In some embodiments, the fourth electroluminescent device is a top light-emitting type electroluminescent device.

In some embodiments, the first electroluminescent device, the second electroluminescent device and the third electroluminescent device are all top light-emitting type electroluminescent devices.

In some embodiments, thicknesses of the first electroluminescent device, the second electroluminescent device, the third electroluminescent device and the fourth electroluminescent device are different.

In some embodiments, the first electroluminescent device, the second electroluminescent device, the third electroluminescent device and the fourth electroluminescent device all further include a hole transport unit. A thickness of each of the first electroluminescent device, the second electroluminescent device, the third electroluminescent device and the fourth electroluminescent device is adjusted by a thickness of a corresponding hole transport unit.

In some embodiments, a thickness of a hole transport unit in the first sub-pixel is a first thickness, a thickness of a hole transport unit in the third sub-pixel is a sum of the first thickness and a second thickness, a thickness of a hole transport unit in the second sub-pixel is a sum of the first thickness, the second thickness and a third thickness, and a thickness of a hole transport unit in the fourth sub-pixel is a sum of the first thickness and the third thickness. A hole transport units of the first thickness is provided in all sub-pixels.

In another aspect, a display device is provided, and the display device includes the above array substrate.

In yet another aspect, a method for manufacturing the array substrate described above is provided. The array substrate includes a plurality of pixels, and each pixel includes a plurality of sub-pixels. The method includes: forming a light-emitting unit in a region of each sub-pixel. A light-emitting unit of each of at least one of the plurality of sub-pixels is formed of a combination of light-emitting materials that are used for forming light-emitting units of another two of the plurality of sub-pixels respectively.

In some embodiments, the plurality of sub-pixels include a first sub-pixel, a second sub-pixel, a third sub-pixel and a fourth sub-pixel. The step of forming a light-emitting unit in a region of each of sub-pixels, a light-emitting unit of each of at least one of the plurality of sub-pixels being formed of a combination of light-emitting materials that are used for forming light-emitting units of another two of the plurality of sub-pixels respectively, includes:

forming a first electroluminescent device in a region of the first sub-pixel of each pixel, the first electroluminescent device comprising a first color light-emitting unit;

forming a second electroluminescent device in a region of the second sub-pixel of each pixel, the second electroluminescent device comprising a second color light-emitting unit;

forming a third electroluminescent device in a region of the third sub-pixel of each pixel, the third electroluminescent device comprising a third color light-emitting unit; and forming a fourth electroluminescent device in a region of the fourth sub-pixel of each pixel, the fourth electroluminescent device comprising the second color light-emitting unit and third color light-emitting unit that are stacked one on another.

In some embodiments, the first color light-emitting unit is formed to emit light of a blue color, the second color light-emitting unit is formed to emit light of a red color, and the third color light-emitting unit is formed to emit light of a green color.

In some embodiments, the first sub-pixel, the second sub-pixel, the third sub-pixel, and the fourth sub-pixel are arranged in a 2×2 array.

The steps of forming a first color light-emitting unit in a region of the first sub-pixel of each pixel, forming a second color light-emitting unit in a region of the second sub-pixel of each pixel, forming a third color light-emitting unit in a region of the third sub-pixel of each pixel, and forming the second color light-emitting unit and the third color light-emitting unit that are stacked one on another in a region of the fourth sub-pixel of each pixel, include:

forming a first color light-emitting layer by evaporation using a first fine mask plate, the first color light-emitting layer comprising first color light-emitting units formed in regions of first sub-pixels of the plurality of pixels respectively;

forming a second color light-emitting layer by evaporation using a second fine mask plate, the second color light-emitting layer comprising second color light-emitting units formed in regions of second sub-pixels and fourth sub-pixels of the plurality of pixels respectively, wherein the second fine mask plate comprises a plurality of second evaporation openings, and one second evaporation opening is used to form second color light-emitting units in the region of the second sub-pixel and the region of the fourth sub-pixel in a corresponding pixel; and forming a third color light-emitting layer by evaporation using a third fine mask plate, the third color light-emitting layer comprising third color light-emitting units in regions of third sub-pixels and fourth sub-pixels of the plurality of pixels respectively, wherein the third fine mask plate comprises a plurality of third evaporation openings, and one third evaporation opening is used to form third color light-emitting units in the region of the third sub-pixel and the region of the fourth sub-pixel in a corresponding pixel.

In some embodiments, the first electroluminescent device, the second electroluminescent device, the third electroluminescent device and the fourth electroluminescent device are all top light-emitting type electroluminescent devices. Thicknesses of the first electroluminescent device, the second electroluminescent device, the third electroluminescent device and the fourth electroluminescent device are different.

The method further includes: forming hole transport units of different thicknesses in the region of the first sub-pixel, the region of the second sub-pixel, the region of the third sub-pixel and the region of the fourth sub-pixel of each pixel respectively. Each of thicknesses of the first electroluminescent device, the second electroluminescent device, the third electroluminescent device and the fourth electroluminescent device is capable of being adjusted according to a thickness of a corresponding hole transport unit.

In some embodiments, the step of forming hole transport units of different thicknesses in the region of the first sub-pixel, the region of the second sub-pixel, the region of the third sub-pixel and the region of the fourth sub-pixel of each of pixels includes:

forming a hole transport layer of a first thickness by evaporation using a first opening mask plate, the hole transport layer of the first thickness comprising hole transport units of the first thickness formed in regions of first sub-pixels, second sub-pixels, third sub-pixels and fourth sub-pixels of the plurality of pixels respectively;

forming a hole transport layer of a second thickness by evaporation using a fourth fine mask plate, the hole transport layer of the second thickness comprising hole transport units of the second thickness formed in regions of second sub-pixels and third sub-pixels of the plurality of pixels respectively, wherein the fourth fine mask plate comprises a plurality of fourth evaporation openings, and one fourth evaporation opening is used to form hole transport units of the second thickness in the region of the second sub-pixel and the region of the third sub-pixel in a corresponding pixel; and forming a hole transport layer of a third thickness by evaporation using a fifth fine mask plate, the hole transport layer of the third thickness comprising hole transport units of the third thickness formed in regions of second sub-pixels and fourth sub-pixels of the plurality of pixels respectively, so that a thickness of a hole transport unit in the second sub-pixel is a sum of the first thickness, the second thickness and the third thickness, a thickness of a hole transport unit in the fourth sub-pixel is a sum of the first thickness and the third thickness, and a thickness of a hole transport unit in the third sub-pixel is a sum of the first thickness and the second thickness, wherein the fifth fine mask plate comprises a plurality of fifth evaporation openings, and one fifth evaporation opening is used to form hole transport units of the third thickness in the region of the second sub-pixel and the region of the fourth sub-pixel in a corresponding pixel.

BRIEF DESCRIPTION OF THE DRAWINGS

In order to describe technical solutions in embodiments of the present disclosure more clearly, the accompanying drawings to be used in the description of embodiments will be introduced briefly. Obviously, the accompanying drawings to be described below are merely some embodiments of the present disclosure, and a person of ordinary skill in the art can obtain other drawings according to those drawings without paying any creative effort.

FIG. 8(e) is a structural formula of Ir(ppy)$_2$(acac);

FIG. 8(f) is a structural formula of B3PYMPM;

FIG. 9(a) is a schematic diagram showing two kinds of thickness combinations of units of a fourth electroluminescent device of a yellow sub-pixel according to some embodiments of the present disclosure;

FIG. 9(b) is a schematic diagram showing parameters of the fourth electroluminescent device corresponding to the two kinds of thickness combinations of the fourth electroluminescent device;

DETAILED DESCRIPTION

The technical solutions in the embodiments of the present disclosure will be described clearly and completely below with reference to the accompanying drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

Figure 1A:
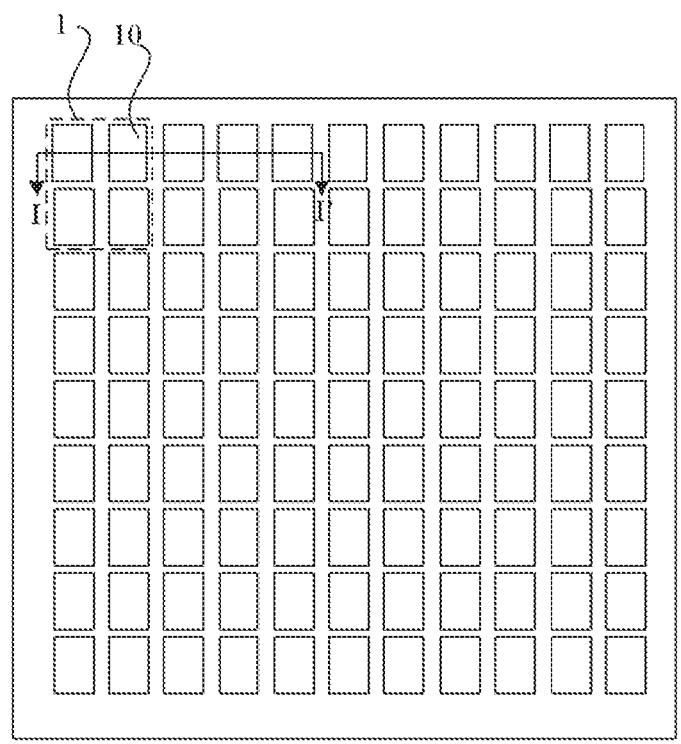
FIG. 1(a) is a schematic diagram of an array substrate according to some embodiments of the present disclosure.
Figure 1B:
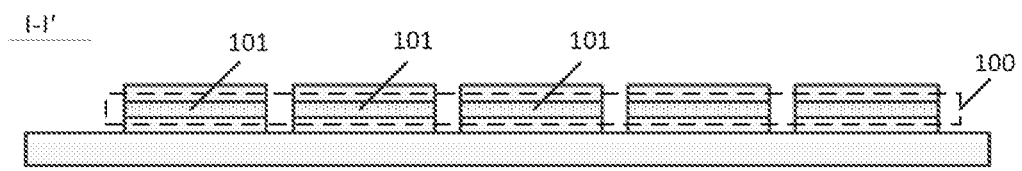
FIG. 1(b) is a sectional diagram of FIG. 1(a) along a line I-I'.

FIG. 1(a) is a schematic diagram of an array substrate according to some embodiments of the present disclosure, and FIG. 1(b) is a sectional diagram of FIG. 1(a) along a line I-I'. As shown in FIG. 1 (a), the array substrate includes a plurality of pixels 1, and each pixel 1 includes a plurality of sub-pixels 10. As shown in FIG. 1(b), the array substrate includes a light-emitting layer 100, and the light-emitting layer 100 includes a plurality of light-emitting unit 101. Each sub-pixel 10 corresponds to (i.e., includes) one light-emitting unit 101.

Some embodiments of the present disclosure provide an array substrate, and as shown in FIG. 1(a), the array substrate includes a plurality of pixels 1. Each pixel 1 includes a plurality of sub-pixels 10. As shown in FIG. 1(b), each sub-pixel 10 includes a light-emitting unit 101, and the light-emitting unit 101 of each of at least one of the plurality of sub-pixel 10 is formed of a combination of light-emitting materials that are used for forming light-emitting units 101 of another two of the plurality of sub-pixels.

In the array substrate provided in the embodiments of the present disclosure, since the light-emitting unit 101 of each of the at least one of the plurality of sub-pixel 10 is formed of a combination of light-emitting materials that are used for forming the light-emitting units 101 of another two of the plurality of sub-pixels, it is possible to reduce the type of light-emitting materials and decrease production cost.

Figure 2A:
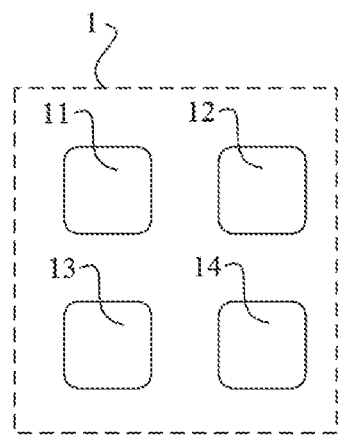
FIG. 2(a) is a schematic diagram showing a plurality of sub-pixels in a pixel according to some embodiments of the present disclosure.
Figure 2B:
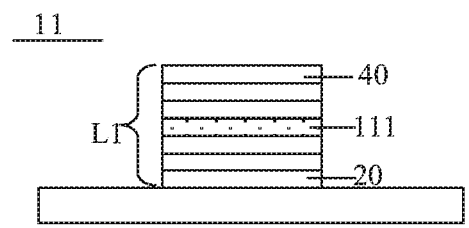
FIG. 2(b) is a schematic diagram of a first sub-pixel according to some embodiments of the present disclosure.
Figure 2C:
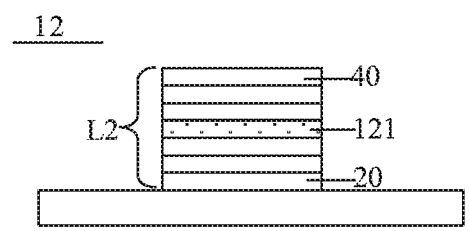
FIG. 2(c) is a schematic diagram of a second sub-pixel according to some embodiments of the present disclosure.
Figure 2D:
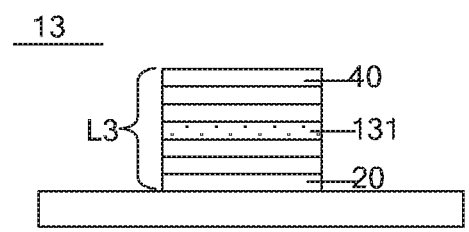
FIG. 2(d) is a schematic diagram of a third sub-pixel according to some embodiments of the present disclosure.
Figure 2E:
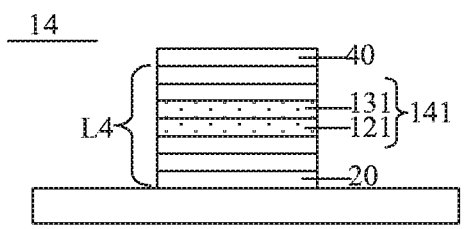
FIG. 2(e) is a schematic diagram of a fourth sub-pixel according to some embodiments of the present disclosure.

In some embodiments, as shown in FIG. 2(a), the plurality of sub-pixels 10 included in each pixel 1 include a first sub-pixel 11, a second sub-pixel 12, a third sub-pixel 13 and a fourth sub-pixel 14. As shown in FIG. 2(b), the first sub-pixel 11 includes a first electroluminescent device L1, and the first electroluminescent device L1 includes a first color light-emitting unit 111. As shown in FIG. 2(c), the second sub-pixel 12 includes a second electroluminescent device L2, and the second electroluminescent device L2 includes a second color light-emitting unit 121. As shown in FIG. 2(d), the third sub-pixel 13 includes a third electroluminescent device L3, and the third electroluminescent device L3 includes a third color light-emitting unit 131. As shown in FIG. 2(e), the fourth sub-pixel 14 includes a fourth electroluminescent device L4, and the fourth electroluminescent device L4 includes a fourth light-emitting unit 141 formed of a combination of light-emitting materials that are used for forming the second color light-emitting unit 121 and the third color light-emitting unit 131.

In some embodiments, the ways to form the fourth light-emitting unit 141 of the fourth electroluminescent device L4 includes the following two ways.

In a first way, the fourth light-emitting unit 141 is formed by mixing the light-emitting materials of the second color light-emitting unit 121 and the third color light-emitting unit 131.

In a second way, as shown in FIG. 2(*e*), the fourth light-emitting unit 141 includes a second color light-emitting unit 121 and a third color light-emitting unit 131 that are stacked one on another.

For the second way, the fourth light-emitting unit 141 includes the second color light-emitting unit 121 and the third color light-emitting unit 131 that are stacked one on another, with the second color light-emitting unit 121 included in the fourth light-emitting unit 141 and the second color light-emitting unit 121 of the second sub-pixel 12 being formed by evaporation using a same fine mask plate, and the third color light-emitting unit 131 included in the fourth light-emitting unit 141 and the third color light-emitting unit 131 of the third sub-pixel 13 being formed by evaporation using a same fine mask plate. Therefore, although the fourth sub-pixels 14 are added in the array substrate, it is not necessary to add a fine mask plate for forming the fourth light-emitting units 141 in the fourth sub-pixels 14. Based on this, it is possible to reduce the use times of the fine mask plate, so as to alleviate the problem of low product yield caused by an increasing use of the fine mask plate and thereby an increasing risk of color mixing. In addition, although the fourth sub-pixels 14 are added, it is not necessary to increase chambers and evaporation sources.

It will be noted that the electroluminescent devices may be various electroluminescent devices such as OLEDs and quantum dot light emitting diodes (QLEDs).

In some embodiments, the color of light emitted by each of the first color light-emitting unit 111, the second color light-emitting unit 121, and the third color light-emitting unit 131 is selected from the three primary colours. On this basis, for the fourth sub-pixel 14, the light emitted by the second color light-emitting unit 121 and the third color light-emitting unit 131 is combined to emit light of a corresponding color without affecting the display, and the light emitted by the fourth sub-pixel 14 is capable of enhancing the performance of certain aspects of the display device to which the array substrate is applied.

In addition, those skilled in the art know that besides including the corresponding light-emitting unit, as shown in FIGS. 2(*b*)-2(*e*), each of electroluminescent devices further includes an anode 20 and a cathode 40, and the anode 20 and the cathode 40 are used to control a light-emitting unit in a corresponding sub-pixel to emit light.

In some embodiments, the first color light-emitting unit 111 is configured to emit light of a blue color, the second color light-emitting unit 121 is configured to emit light of a red color, and the third color light-emitting unit 131 is configured to emit light of a green color. That is, a first color is blue, a second color is red, and a third color is green. In other words, the first color light-emitting unit 111 is a blue light-emitting unit, the second color light-emitting unit 121 is a red light-emitting unit, and the third color light-emitting unit 131 is a green light-emitting unit. On this basis, the fourth light-emitting unit 141 of the fourth sub-pixel 14 includes a red light-emitting unit and a green light-emitting unit that are stacked one on another, or the fourth light-emitting unit 141 of the fourth sub-pixel 14 is formed by mixing the light-emitting materials of the red light-emitting unit and the green light-emitting unit, and the light of the red color and the light of the green color are superposed to visually appear light of a yellow color.

In the case where the fourth light-emitting unit 141 of the fourth sub-pixel 14 includes a red light-emitting unit and a green light-emitting unit that are stacked one on another, in some embodiments, as shown in FIG. 2(*e*), the red light-emitting unit of the fourth sub-pixel 14 is below and the green light-emitting unit of the fourth sub-pixel 14 is above. That is, the green light-emitting unit of the fourth sub-pixel 14 is disposed on a side of the red light-emitting unit away from a base.

Since the light of the yellow color is obtained by combining the light of the green color that is emitted by green light-emitting materials with the light of the red color that is emitted by red light-emitting materials, it is possible to reduce the production cost without adding yellow evaporation materials. In addition, the light of the white color is obtained by combining the light of the blue color, the light of the red color and the light of the green color, and the light of the white color is also obtained by combining the light of the blue color and the light of the yellow color; thus it is possible to increase the brightness of light of the white color and reduce power consumption.

In some embodiments, as shown in FIG. 2(*a*), the first sub-pixel 11, the second sub-pixel 12, the third sub-pixel 13, and the fourth sub-pixel 14 are arranged in a 2×2 array.

In the case where the first sub-pixel 11, the second sub-pixel 12, the third sub-pixel 13, and the fourth sub-pixel 14 are arranged in a 2×2 array, any two sub-pixels are adjacently disposed in an i-th row, and the other two sub-pixels are adjacently disposed in an i+1th row, where i is a positive integer.

In some embodiments, the first sub-pixel 11 includes a blue light-emitting unit, and the first sub-pixel 11 is referred to as a blue sub-pixel B. The second sub-pixel 12 includes a red light-emitting unit, and the second sub-pixel 12 is referred to as a red sub-pixel R. The third sub-pixel 13 includes a green light-emitting unit, and the third sub-pixel 13 is referred to as a green sub-pixel G. The fourth sub-pixel 14 is referred to as a yellow sub-pixel Y.

Figure 3A:
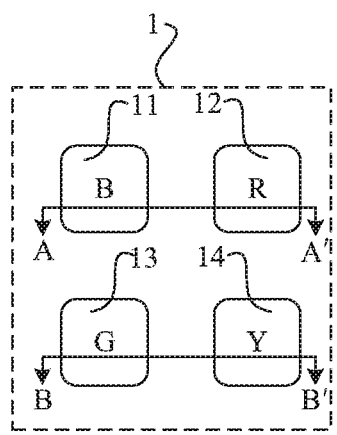
FIG. 3(a) is a schematic diagram showing an arrangement of a plurality of sub-pixels in a pixel according to some embodiments of the present disclosure.
Figure 3B:
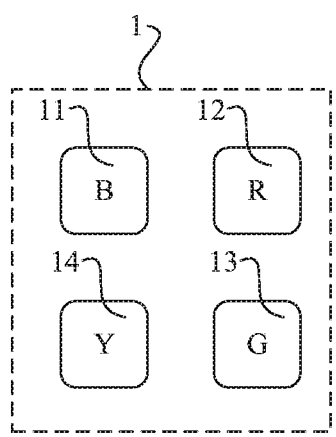
FIG. 3(b) is a schematic diagram showing another arrangement of a plurality of sub-pixels in a pixel according to some embodiments of the present disclosure.
Figure 3C:
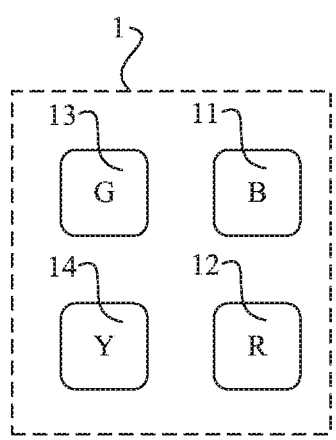
FIG. 3(c) is a schematic diagram showing yet another arrangement of a plurality of sub-pixels in a pixel according to some embodiments of the present disclosure.

Based on this, in some embodiments, as shown in FIG. 3(*a*) and FIG. 3(*b*), the blue sub-pixel B and the red sub-pixel R are adjacently disposed in the i-th row, and the green sub-pixel G and the yellow sub-pixel Y are adjacently disposed in the i+1th row, so that the four sub-pixels are arranged in an array.

In some other embodiments, as shown in FIG. 3(*c*), the blue sub-pixel B and the green sub-pixel G are adjacently disposed in the i-th row, and the red sub-pixel R and the yellow sub-pixel Y are adjacently disposed in the i+1th row, so that the four sub-pixels are arranged in an array.

In some other embodiments, the blue sub-pixel B and the yellow sub-pixel Y are adjacently disposed in the i-th row, and the red sub-pixel R and the green sub-pixel G are adjacently disposed in the i+1th row, so that the four sub-pixels are arranged in an array.

It will be noted that the specific value of the number i is related to the location of the current pixel.

By arranging the first sub-pixel 11, the second sub-pixel 12, the third sub-pixel 13, and the fourth sub-pixel 14 in a 2×2 array, second color light-emitting units 121 may be formed through one evaporation opening of a fine mask plate in the regions of the second sub-pixel 12 and the fourth sub-pixel 14 of the four sub-pixels, and third color light-emitting units 131 may be formed through one evaporation opening of a fine mask plate in the regions of the third sub-pixel 13 and the fourth sub-pixel 14 of the four sub-pixels, so as to reduce the fabrication process difficulty of the two fine mask plates when the array substrate is applied to high resolution display devices.

Those skilled in the art will know that in some other embodiments, second color light-emitting units 121 are formed in the regions of the second sub-pixel 12 and the fourth sub-pixel 14 through evaporation openings of the fine mask plate, respectively. Similarly, third color light-emitting units 131 are formed in the regions of the third sub-pixel 13 and the fourth sub-pixel 14 through evaporation openings of a fine mask plate, respectively.

In some embodiments, the fourth electroluminescent device L4 is a top light-emitting type electroluminescent device.

In the case where the fourth electroluminescent device L4 is a top light-emitting type electroluminescent device, the fourth electroluminescent device L4 has an obvious micro-cavity effect.

The micro-cavity effect mainly means that the optical interference inside the electroluminescent device is redistributed by the photon density of different energy states, so that only light of a specific wavelength may exit at a specific angle after conforming to the resonant cavity mode.

When the fourth light-emitting unit 141 of the fourth sub-pixel 14 is formed by mixing the light-emitting materials of the red light-emitting unit and the green light-emitting unit, a new spectrum is obtained by superposing the red light spectrum with the green light spectrum. Due to the micro-cavity effect, the red part and green part in the original spectrum are suppressed, and the yellow part is strengthened. As a result, the fourth sub-pixel 14 emits the light of the yellow color. Based on this, when the fourth sub-pixel 14 emits the light of the yellow color due to the micro-cavity effect, it is possible to enhance the capability of yellow performance, broaden the color gamut of the display, and enrich the display color.

In some embodiments, the first electroluminescent device L1, the second electroluminescent device L2 and the third electroluminescent device L3 are all top light-emitting type electroluminescent devices.

In some embodiments, the first electroluminescent device L1, the second electroluminescent device L2, the third electroluminescent device L3 and the fourth electroluminescent device L4 are all top light-emitting type electroluminescent devices, which may reduce the fabrication process. In addition, the respective electroluminescent devices may be optically adjusted based on the micro-cavity effect.

In some embodiments, thicknesses of the first electroluminescent device L1, the second electroluminescent device L2, the third electroluminescent device L3 and the fourth electroluminescent device L4 are different.

It will be understood by those skilled in the art that the thicknesses of the electroluminescent devices are adjusted for the purpose of modulating the micro-cavity effect, and the purpose of modulating the micro-cavity effect is to modulate the luminescence spectrum to obtain colors that meet requirements of color purity, color gamut, and the like.

Figure 4:
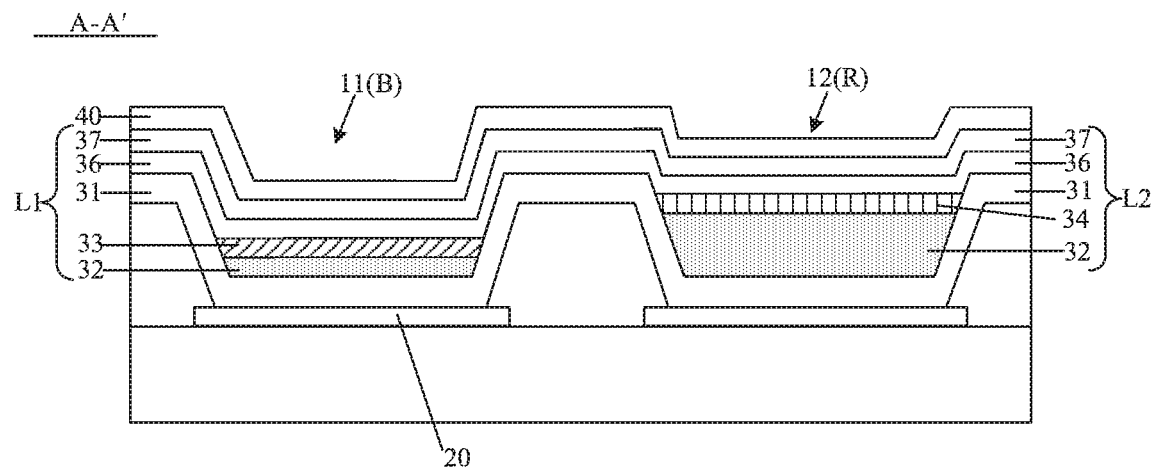
FIG. 4 is a sectional diagram of FIG. 3(a) along a line A-A'.
Figure 5:
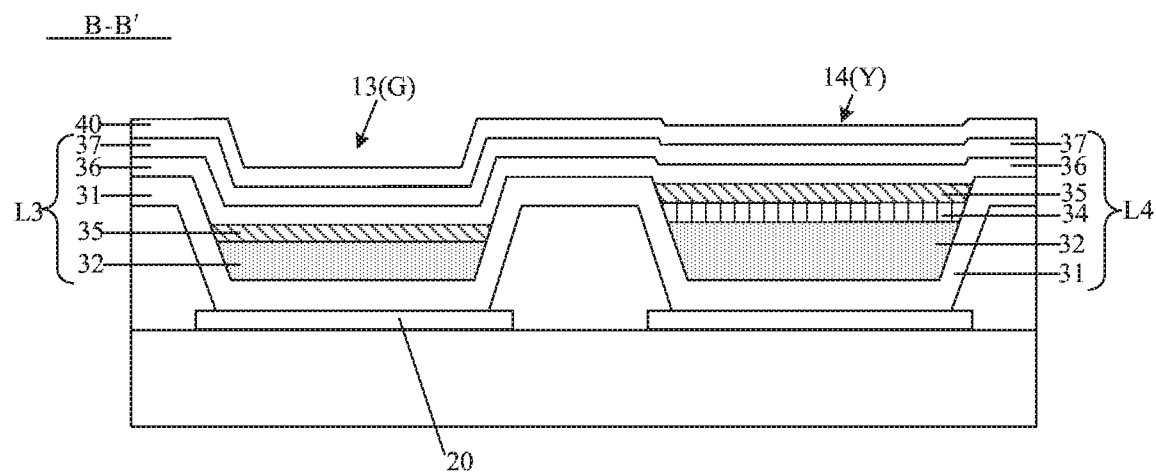
FIG. 5 is a sectional diagram of FIG. 3(a) along a line B-B'.

In some embodiments, as shown in FIGS. 4 and 5, the first electroluminescent device L1, the second electroluminescent device L2, the third electroluminescent device L3 and the fourth electroluminescent device L4 all further include a hole transport unit 32. Each of thicknesses of the first electroluminescent device L1, the second electroluminescent device L2, the third electroluminescent device L3 and the fourth electroluminescent device L4 are adjusted by a thickness of a corresponding hole transport unit 32.

In some embodiments, a thickness of a hole transport unit 32 in the first sub-pixel 11 is a first thickness, a thickness of a hole transport unit 32 in the third sub-pixel 13 is a sum of the first thickness and a second thickness, a thickness of a hole transport unit 32 in the second sub-pixel 12 is a sum of the first thickness, the second thickness and a third thickness, and a thickness of a hole transport unit 32 in the fourth sub-pixel 14 is a sum of the first thickness and the third thickness, so that thicknesses of the hole transport units 32 in each pixel are not the same.

Figure 6:
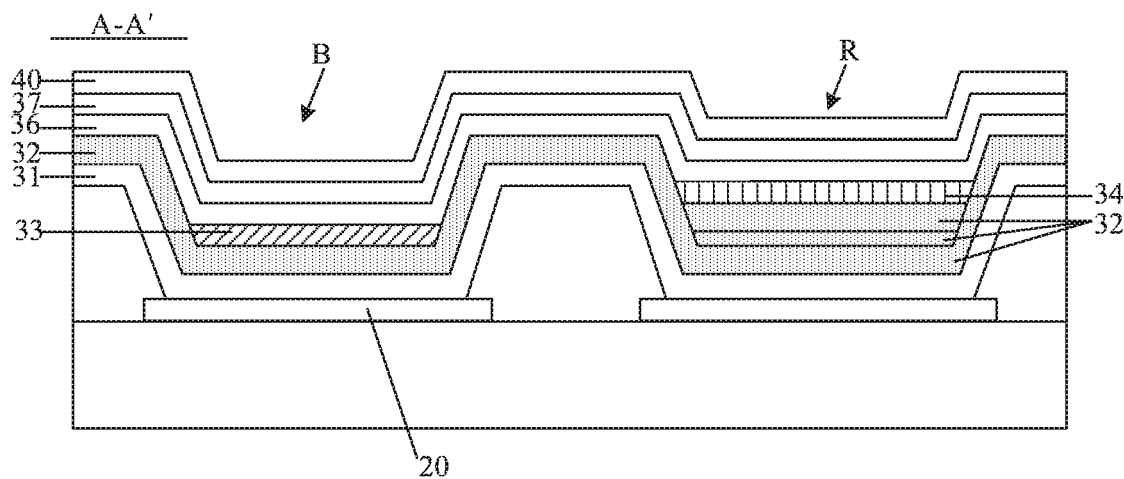
FIG. 6 is another sectional diagram of FIG. 3(a) along a line A-A'.

On this basis, in some embodiments, the hole transport unit 32 of the first thickness is provided in all sub-pixels. That is, as shown in FIG. 6, a hole transport layer of the first thickness, which includes all hole transport units 32 of the first thickness, completely covers the base.

For the modulation of the micro-cavity effect, an emission wavelength of each of sub-pixels will be considered. The smaller the emission wavelength is, the smaller the thickness of the corresponding electroluminescent device is. In the case where the first color is blue, the second color is red, the third color is green and the fourth color is yellow, since the wavelength range of blue light is 476-495 nm, the wavelength range of green light is 495-570 nm, the wavelength range of yellow light is 570-590 nm, and the wavelength range of red light is 620-750 nm, that is, the wavelength of the blue light is less than the wavelength of the green light, the wavelength of the green light is less than the wavelength of the yellow light, and the wavelength of the yellow light is less than the wavelength of the red light, a thickness of a hole transport unit 32 corresponding to the blue light is the smallest, a thickness of a hole transport unit 32 corresponding to the green light is the second smallest, a thickness of a hole transport unit 32 corresponding to the yellow light is the third smallest, and a thickness of a hole transport unit 32 corresponding to the red light is the largest.

Based on this, a thickness of a hole transport unit 32 in the first sub-pixel 11 that has a smallest emission wavelength is a first thickness, a thickness of a hole transport unit 32 in the third sub-pixel 13 that has the second smallest emission wavelength is a sum of the first thickness and the second thickness, a thickness of a hole transport unit 32 in the fourth sub-pixel 14 that has an emission wavelength greater than that of the third sub-pixel 13 is a sum of the first thickness and the third thickness, in which the third thickness is greater than the second thickness, and a thickness of a hole transport unit 32 in the second sub-pixel 12 that has a largest emission wavelength is a sum of the first thickness, the second thickness and the third thickness.

Since the hole transport layer, which includes the hole transport units 32 of the first thickness, is formed by evaporation using an opening mask plate, it is not necessary to use a fine mask plate. In addition, since both the second sub-pixel 12 and the third sub-pixel 13 in the four sub-pixels arranged in an 2×2 array have a hole transport unit 32 of the second thickness, a hole transport layer of the second thickness, which includes the hole transport unit 32 of the second thickness that is located in each of the second sub-pixels 12 and the third sub-pixels 13, may be formed through a fine mask plate, and one evaporation opening of the fine mask plate is used to form hole transport units 32 of the second thickness that are respectively located in the second sub-pixel 12 and the third sub-pixel 13, so as to reduce the fabrication process difficulty of the fine mask plate. Furthermore, since hole transport units 32 of the third thickness are respectively located in the second sub-pixel 12 and the fourth sub-pixel 14 in the four sub-pixels arranged in an 2×2 array, a hole transport layer of the third thickness, which includes hole transport unit 32 of the third thickness that is located in each of the second sub-pixels 12 and the fourth sub-pixels 14, may be formed through a fine mask plate, and one evaporation opening of the fine mask plate is used to form hole transport units 32 of the third thickness that are located in the second sub-pixel 12 and the fourth sub-pixel 14 respectively, so as to reduce the fabrication process difficulty of the fine mask plate.

In some embodiments, as shown in FIGS. 4 and 5, the first electroluminescent device L1, the second electroluminescent device L2, the third electroluminescent device L3 and the fourth electroluminescent device L4 all further include a hole injection unit 31, an electron transport unit 36 and an electron injection unit 37. A hole injection layer including all hole injection units 31, an electron transport layer including all electron transport units 36 and an electron injection layer including all electron injection units 37 all cover the base. Thicknesses of the hole injection units 31 in all sub-pixels are the same, thicknesses of the electron transport units 36 in all sub-pixels are the same, and thicknesses of the electron injection units 37 in all sub-pixels are the same. In this way, each of the hole injection layer, the electron transport layer, and the electron injection layer may be formed by evaporation using an opening mask plate without a need to use a fine mask plate.

FIG. 3(a) shows an example of an arrangement of the first sub-pixel 11, the second sub-pixel 12, the third sub-pixel 13, and the fourth sub-pixel 14, in which the first sub-pixel 11, the second sub-pixel 12, the third sub-pixel 13, and the fourth sub-pixel 14 are respectively the blue sub-pixel B, the red sub-pixel R, the green sub-pixel G, and the yellow sub-pixel Y.

FIG. 4 is a sectional diagram of FIG. 3(a) along a line A-A'. As shown in FIG. 4, the blue sub-pixel B includes a first electroluminescent device L1, and the first electroluminescent device L1 includes an anode 20, a hole injection unit 31, a hole transport unit 32, a blue light-emitting unit 33, an electron transport unit 36, an electron injection unit 37, and a cathode 40 which are sequentially disposed on the base. As shown in FIG. 4, the red sub-pixel R includes a second electroluminescent device L2, and the second electroluminescent device L2 includes an anode 20, a hole injection unit 31, a hole transport unit 32, a red light-emitting unit 34, an electron transport unit 36, an electron injection unit 37, and a cathode 40 which are sequentially disposed on the base.

FIG. 5 is a sectional diagram of FIG. 3(a) along a line B-B'. As shown in FIG. 5, the green sub-pixel G includes a third electroluminescent device L3, and the third electroluminescent device L3 includes an anode 20, a hole injection unit 31, a hole transport unit 32, a green light-emitting unit 35, an electron transport unit 36, an electron injection unit 37, and a cathode 40 which are sequentially disposed on the base. As shown in FIG. 5, the yellow sub-pixel Y includes a fourth electroluminescent device L4, and the fourth electroluminescent device L4 includes an anode 20, a hole injection unit 31, a hole transport unit 32, a red light-emitting unit 34, a green light-emitting unit 35, an electron transport unit 36, an electron injection unit 37, and a cathode 40 which are sequentially disposed on the base. The first electroluminescent device L1, the second electroluminescent device L2, the third electroluminescent device L3 and the fourth electroluminescent device L4 are all top light-emitting type electroluminescent devices.

In some embodiments, as shown in FIGS. 4 and 5, the hole injection units 31 in all the sub-pixels are integrated to form a hole injection layer, the electron transport units 36 in all the sub-pixels are integrated to form an electron transport layer, and the electron injection units 37 in all the sub-pixels are integrated to form an electron injection layer, and the cathodes 40 in all the sub-pixels are also integrated to form a cathode layer.

Each of the thicknesses of the first electroluminescent device L1, the second electroluminescent device L2, the third electroluminescent device L3 and the fourth electroluminescent device L4 is adjusted by a thickness of a corresponding hole transport unit 32. In some embodiments, a thickness of a hole transport unit 32 in the blue sub-pixel B is less than that of a hole transport unit 32 in the green sub-pixel G, a thickness of a hole transport unit 32 in the green sub-pixel G is less than that of a hole transport unit 32 in the yellow sub-pixel Y, and a thickness of a hole transport unit 32 in the yellow sub-pixel Y is less than that of a hole transport unit 32 in the red sub-pixel R.

Figure 7:
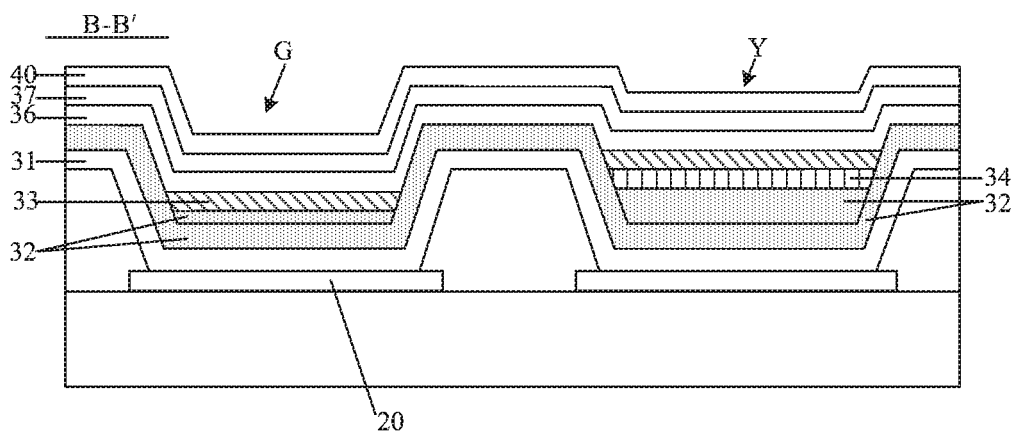
FIG. 7 is another sectional diagram of FIG. 3(a) along a line B-B'.

In some embodiments, if the thickness of the hole transport unit 32 in blue sub-pixel B is a first thickness, as shown in FIGS. 6 and 7, the thickness of the hole transport unit 32 in the green sub-pixel G is a sum of the first thickness and a second thickness, the thickness of the hole transport unit 32 in the yellow sub-pixel Y is a sum of the first thickness and the third thickness, and the thickness of the hole transport unit 32 in the red sub-pixel R is a sum of the first thickness, the second thickness and a third thickness. The third thickness is greater than the second thickness.

In order to better illustrate the role of the micro-cavity effect in the yellow light chromaticity coordinates, an example will be described below.

Figure 8A:
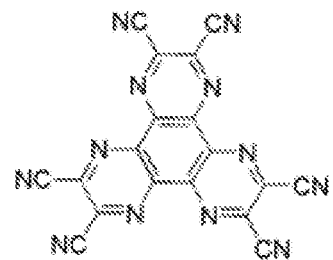
FIG. 8(a) is a structural formula of HATCN.

The anode 20 of the fourth electroluminescent device L4 is of a stack structure of ITO (Indium Tin Oxide)/Ag (Silver)/ITO. The material of the hole injection unit 31 is HATCN (1, 4, 5, 8, 9, 12-hexaazatriphenylene-2, 3, 6, 7, 10, 11-hexacarbonitrile), the structural formula of which is as shown in FIG. 8(a).

Figure 8B:
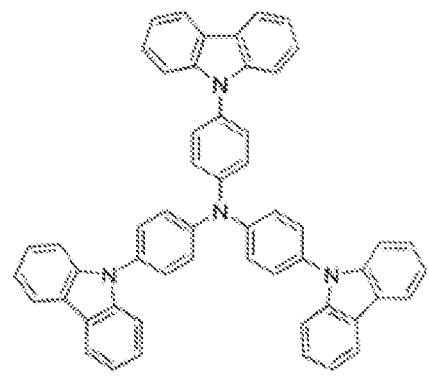
FIG. 8(b) is a structural formula of TCTA.
Figure 8C:
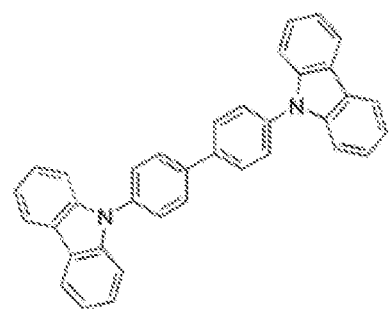
FIG. 8(c) is a structural formula of CBP.
Figure 8D:
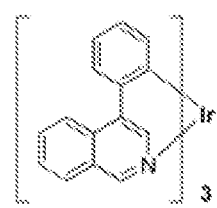
FIG. 8(d) is a structural formula of Ir(piq)$_3$.

The material of the hole transport unit 32 is TCTA (4, 4', 4"-tris(carbazol-9-yl)-triphenylamine), the structural formula of which is as shown in FIG. 8(b). The material of the red light-emitting unit 34 is CBP (4, 4'-bis (9-carbazole) biphenyl): Ir(piq)$_3$(tris[1-phenylisoquinoline-C2, N] iridium (III)), the structural formula of CBP is as shown in FIG. 8(c), and the structural formula of Ir(piq)$_3$ is as shown in FIG. 8(d). The material of the green light-emitting unit 35 is TCTA: Ir(ppy)$_2$(acac)(acetylacetonato bis(2-phenylpyridine)iridium): B3PYMPM (4, 6-bis(3, 5-bis(3-pyridyl)phenyl)-2-methyl pyridine), the structural formula of Ir(ppy)$_2$ (acac) is as shown in FIG. 8(e), and the structural formula of B3PYMPM is as shown in FIG. 8(f). The material of the electron transport unit 36 is B3PYMPM. The material of the electron injection unit 37 is LiF (lithium fluoride). The material of the cathode 40 is Mg (magnesium)/Ag.

If there are two kinds of fourth electroluminescent devices L4 with different thicknesses as shown in FIG. 9(a), the corresponding parameters of the fourth electroluminescent devices L4 are as shown in FIG. 9(b).

It will be seen from FIG. 9(b) that under the micro-cavity effect of the fourth electroluminescent device L4, although the film thickness variation of the hole transport unit 32 is only 50 Å, the chromaticity coordinates of the fourth electroluminescence device L4 have changed significantly, which also shows that the micro-cavity effect of the electroluminescent device is obvious.

Figure 10A:
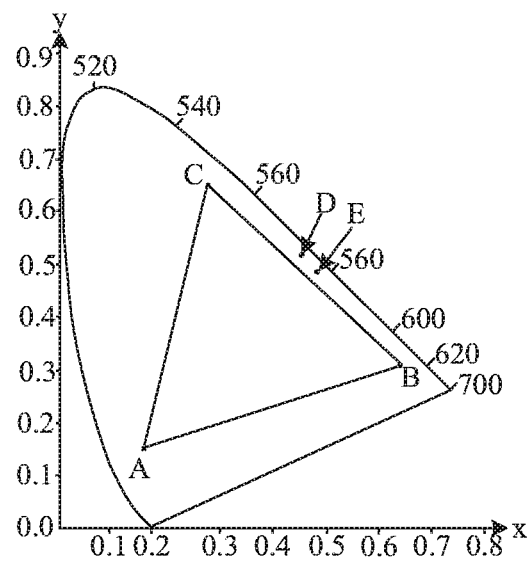
FIG. 10(a) is a schematic diagram showing color gamut ranges of R, G, and B according to some embodiments of the present disclosure.

As can be seen from the Commission Internationale de L'Eclairage (CIE) 1931 chromaticity diagram as shown in FIG. 10(a), when each of pixels only includes the blue sub-pixel B, the red sub-pixel R, and the green sub-pixel G, the triangular color gamut range consisting of three points A (chromaticity coordinate (0.14, 0.13)), B(chromaticity coordinate (0.64, 0.31)), and C(chromaticity coordinate (0.28, 0.65)) does not contain the yellow light chromaticity coordinates (point D and point E in FIG. 10(a)) of the fourth electroluminescent devices L4 with the above two thicknesses.

Figure 10B:
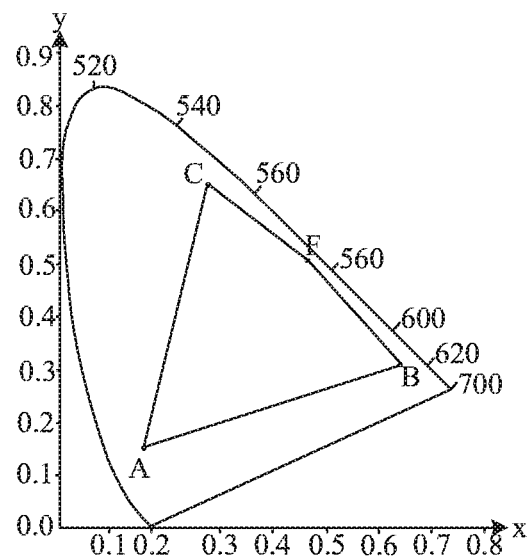
FIG. 10(b) is a schematic diagram showing color gamut ranges of R, G, B and Y according to some embodiments of the present disclosure.

As shown in FIG. 10(b), in some embodiments, the capability of yellow performance is enhanced by adding the yellow sub-pixel Y and by the micro-cavity effect of the fourth electroluminescent device L4, so that the triangular color gamut range that is originally surrounded by the points A, B, and C becomes a color gamut range that is surrounded by points A, B, C, and F, which broadens the color gamut of the display and creates more color combinations, thereby enriching the display color.

Based on the above description, in some embodiments, each of sub-pixels further includes a thin film transistor (TFT), and a driving circuit that is constructed by TFT is used to drive the light-emitting unit in the corresponding sub-pixel to emit light. In some embodiments, the TFT uses one of an oxide, a silicon material, and an organic material as an active layer. In some embodiments, the TFT has a bottom-gate structure, and in some other embodiments, the TFT has a top-gate structure.

In some embodiments, the array substrate further includes a cathode protective layer disposed on a side of the cathodes 40 away from the base, and the cathode protective layer covers the cathodes 40.

Some embodiments of the present disclosure provide a display device, which includes the above array substrate. The display device has the same technical effects as the array substrate.

Some embodiments of the present disclosure provide a method for manufacturing an array substrate, such as the array substrate described above. As shown in FIG. 1(a), the array substrate includes a plurality of pixels 1, and each pixel 1 includes a plurality of sub-pixels 10. The method for manufacturing the array substrate includes: as shown in FIG. 1(b), forming a light-emitting unit 101 in a region of each sub-pixel 10. The light-emitting unit 101 of each of at least one of the plurality of sub-pixel 10 is formed of a combination of light-emitting materials that are used for forming light-emitting units 101 of another two of the plurality of sub-pixels 10. The method for manufacturing the array substrate has the same technical effects as the above array substrate, and thus the effects will not be elaborated here.

In some embodiments, as shown in FIG. 2(a), the plurality of sub-pixels 10 included in each pixel include a first sub-pixel 11, a second sub-pixel 12, a third sub-pixel 13 and a fourth sub-pixel 14.

Based on this, in some embodiments, the step of forming the light-emitting unit 101 in the region of each sub-pixel 10, and the light-emitting unit 101 of each of at least one of the plurality of sub-pixel being formed of a combination of light-emitting materials that are used for forming the light-emitting units 101 of another two of the plurality of sub-pixels 10, includes: as shown in FIG. 2(b), forming a first electroluminescent device L1 in a region of the first sub-pixel 11 of each pixel 1, the first electroluminescent device L1 including a first color light-emitting unit 111; as shown in FIG. 2(c), forming a second electroluminescent device L2 in a region of the second sub-pixel 12 of each pixel 1, the second electroluminescent device L2 including a second color light-emitting unit 121; as shown in FIG. 2(d), forming a third electroluminescent device L3 in a region of the third sub-pixel 13 of each pixel 1, the third electroluminescent device L3 including a third color light-emitting unit 131; and as shown in FIG. 2(e), forming a fourth electroluminescent device L4 in a region of the fourth sub-pixel 14 of each pixel 1, the fourth electroluminescent device L4 including the second color light-emitting unit 121 and third color light-emitting unit 131 that are stacked one on another.

In some other embodiments, the fourth light-emitting unit 141 of the fourth electroluminescent device L4 is formed by mixing the light-emitting materials of the second color light-emitting unit 121 and the third color light-emitting unit 131.

It will be noted that each of light emitted by the first color light-emitting unit 111, the second color light-emitting unit 121, and the third color light-emitting unit 131 will be selected from the three primary colours. On this basis, for the fourth sub-pixel 14, the light emitted by the second color light-emitting unit 121 and the third color light-emitting unit 131 will be combined to emit light of a corresponding color without affecting the display, and the light emitted by the fourth sub-pixel 14 is capable of enhancing the performance of certain aspects of the display device to which the array substrate is applied.

In addition, those skilled in the art know that besides forming the light-emitting units, as shown in FIGS. 2(b)-2(e), the method further includes: forming an anode 20 and a cathode 40 in the region of each sub-pixel 10, and the anode 20 and the cathode 40 are used to control a light-emitting unit in a corresponding sub-pixel to emit light.

The fourth light-emitting unit 141 of the fourth electroluminescent device L4 includes the second color light-emitting unit 121 and third color light-emitting unit 131 that are stacked one on another, with the second color light-emitting unit 121 included in the fourth light-emitting unit 141 and the second color light-emitting unit 121 of the second sub-pixel 12 being formed by evaporation using a same fine mask plate, and the third color light-emitting unit 131 included in the fourth light-emitting unit 141 and the third color light-emitting unit 131 of the third sub-pixel 13 being formed by evaporation using a same fine mask plate. Therefore, although fourth sub-pixels 14 are added in the array substrate, it is not necessary to add a fine mask plate for forming the light-emitting units 141 of the fourth electroluminescent devices L4 in the fourth sub-pixels 14, and is not necessary to increase chambers and evaporation sources, either.

In some embodiments, the first color is blue, the second color is red, and the third color is green. That is, the first color light-emitting unit 111 is a blue light-emitting unit, the second color light-emitting unit 121 is a red light-emitting unit, and the third color light-emitting unit 131 is a green light-emitting unit. On this basis, the fourth sub-pixel 14 includes a red light-emitting unit and a green light-emitting unit that are stacked one on another, and the red light and green light are superposed to visually take on yellow light.

In some embodiments, the red light-emitting unit of the fourth sub-pixel 14 is below and the green light-emitting unit of the fourth sub-pixel 14 is above. That is, the red light-emitting unit of the fourth sub-pixel 14 is formed on a side of the green light-emitting unit of the fourth sub-pixel 14 close to the base.

Since the yellow light is obtained by combining the green light that is emitted by the green light-emitting unit and the red light that is emitted by the red light-emitting unit, it is possible to reduce the production cost without adding the yellow light evaporation materials. In addition, the white light is obtained by combining the blue light, the red light and the green light, and the white light may also be obtained by combining the blue light and the yellow light. Therefore, brightness of the white light may be increased and the power consumption may be reduced.

In some embodiments, as shown in FIG. 2(a), the first sub-pixel 11, the second sub-pixel 12, the third sub-pixel 13, and the fourth sub-pixel 14 are arranged in a 2×2 array.

In the case where the first sub-pixel 11, the second sub-pixel 12, the third sub-pixel 13, and the fourth sub-pixel 14 are arranged in a 2×2 array, any two sub-pixels are adjacently disposed in the i-th row, and the other two sub-pixels are adjacently disposed in the i+1th row. The number i is a positive integer. The value of the number i will be related to the location of the current pixel.

Figure 11:
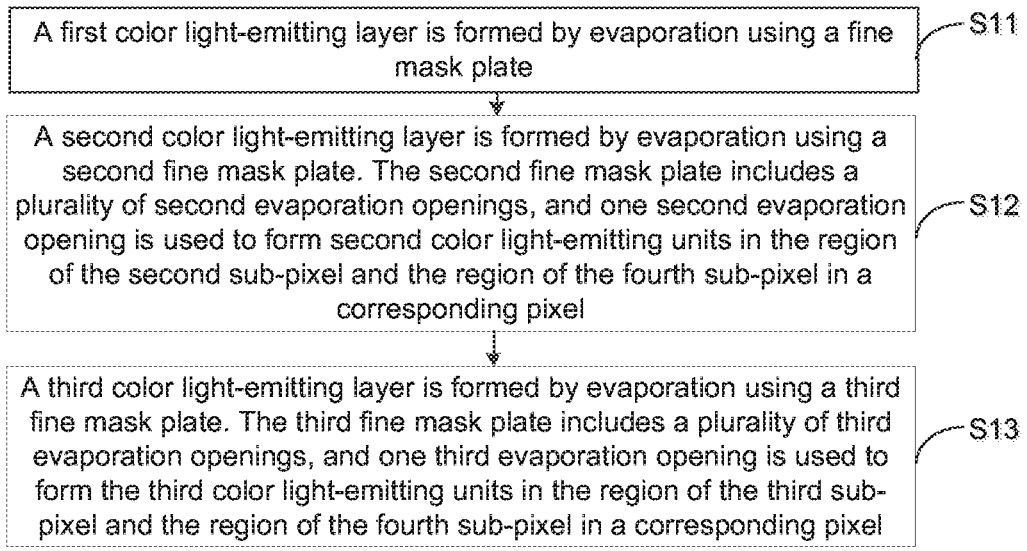
FIG. 11 is a flow chart of a method for manufacturing light-emitting units of sub-pixels according to some embodiments of the present disclosure.

Based on this, in some embodiments, the steps of forming the first color light-emitting unit 111 in the region of the first sub-pixel 11 of each pixel 1, forming the second color light-emitting unit 121 in the region of the second sub-pixel 12 of each pixel 1, forming the third color light-emitting unit 131 in the region of the third sub-pixel 13 of each pixel 1, and forming the second color light-emitting unit 121 and the third color light-emitting unit 131 that are stacked one on another in the region of the fourth sub-pixel 14 of each pixel 1, as shown in FIG. 11, include the following steps 11-13 (S11-S13).

In S11, a first color light-emitting layer is formed by evaporation using a first fine mask plate. The first color light-emitting layer includes first color light-emitting units 111 formed in regions of first sub-pixels 11 of the plurality of pixels 1 respectively.

Figure 12A:
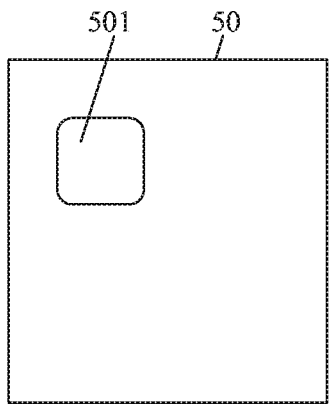
FIG. 12(a) is a schematic diagram of a portion of a first fine mask plate according to some embodiments of the present disclosure.
Figure 12B:
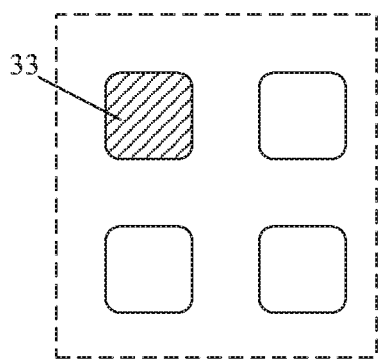
FIG. 12(b) is a schematic diagram showing a blue light-emitting unit formed in a region of a blue sub-pixel after evaporation by using the first fine mask plate of FIG. 12(a)

In the case where the first sub-pixel 11, the second sub-pixel 12, the third sub-pixel 13, and the fourth sub-pixel 14 are respectively the blue sub-pixel B, the red sub-pixel R, the green sub-pixel G, and the yellow sub-pixel Y, if the four sub-pixels are arranged in the manner as shown in FIG. 3(a) or FIG. 3(b), in some embodiments, a blue light-emitting unit 33 (as shown in FIG. 12(b)) is formed by evaporation using the first fine mask plate 50 as shown in FIG. 12(a) in a region of the blue sub-pixel B. The first fine mask plate 50 includes a plurality of first evaporation opening 501, and one first evaporation opening 501 is used to form a blue light-emitting unit 33 by evaporation in the region of the blue sub-pixel B of one pixel 1.

It will be noted that FIGS. 12(a) and 12(b) are merely illustrated for the example of forming the blue light-emitting unit 33 in a region of a blue sub-pixel B of one pixel 1.

Figure 13A:
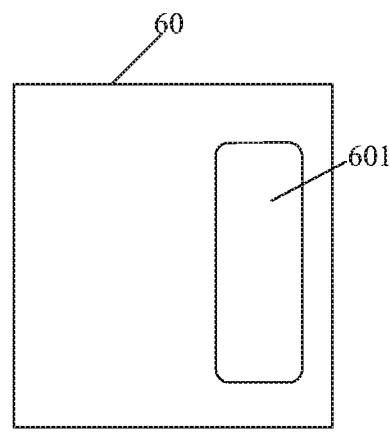
FIG. 13(a) is a schematic diagram of a portion of a second fine mask plate according to some embodiments of the present disclosure.
Figure 13B:
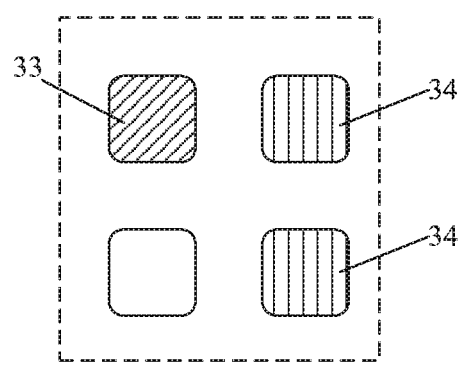
FIG. 13(b) is a schematic diagram showing red light-emitting units formed in regions of red and yellow sub-pixels after evaporation by using the second fine mask plate of FIG. 13(a)

In S12, a second color light-emitting layer is formed by evaporation using a second fine mask plate. The second color light-emitting layer includes second color light-emitting units 121 formed in regions of second sub-pixels 12 and fourth sub-pixels 14 of the plurality of pixels 1 respectively. As shown in FIGS. 13(a) and 13(b), the second fine mask plate 60 includes a plurality of second evaporation openings 601, and one second evaporation opening 601 is used to form second color light-emitting units 121 in the region of the second sub-pixel 12 and the region of the fourth sub-pixel 14 in a corresponding pixel.

In some embodiments, on the basis of the blue light-emitting unit 33 formed in the region of the blue sub-pixel B, red light-emitting units 34 (as shown in FIG. 13(b)) are formed by evaporation using the second fine mask plate 60 as shown in FIG. 13(a) in a region of the red sub-pixel R and a region of the yellow sub-pixel Y. One second evaporation opening 601 of the second fine mask plate 60 is used to form the red light-emitting units 34 by evaporation in the region of the red sub-pixel R and the region of the yellow sub-pixel Y of one pixel 1.

Figure 13C:
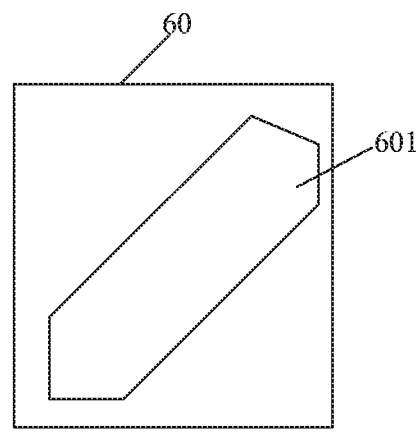
FIG. 13(c) is a schematic diagram of a portion of another second fine mask plate according to some embodiments of the present disclosure.
Figure 13D:
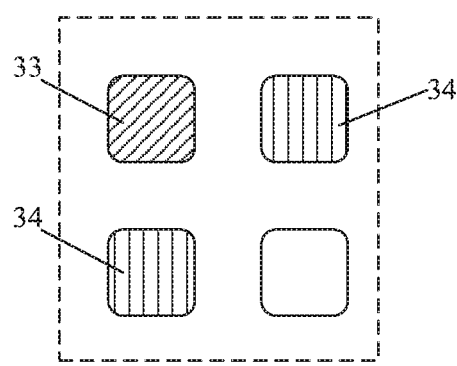
FIG. 13(d) is a schematic diagram showing red light-emitting units formed in regions of red and yellow sub-pixels after evaporation by using the second fine mask plate of FIG. 13(c)

In some other embodiments, on the basis of the blue light-emitting unit 33 formed in the region of the blue sub-pixel B, red light-emitting units 34 (as shown in FIG. 13(d)) are formed by evaporation using the second fine mask plate 60 as shown in FIG. 13(c) in a region of the red sub-pixel R and a region of the yellow sub-pixel Y respectively.

It will be noted that FIG. 13(a)-FIG. 13(d) are merely illustrated for the example of forming the red light-emitting units 34 in a red sub-pixel R and a yellow sub-pixel Y of one pixel 1.

It will be understood by those skilled in the art that in some other embodiments, second color light-emitting units 121 are formed in the region of the second sub-pixel 12 and the region of the fourth sub-pixel 14 of each pixel 1 through evaporation openings of a fine mask plate, respectively.

Figure 14A:
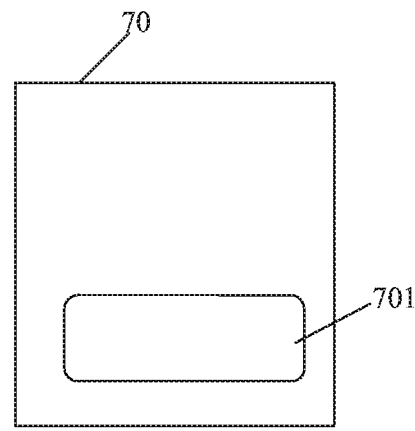
FIG. 14(a) is a schematic diagram of a portion of a third fine mask plate according to some embodiments of the present disclosure.
Figure 14B:
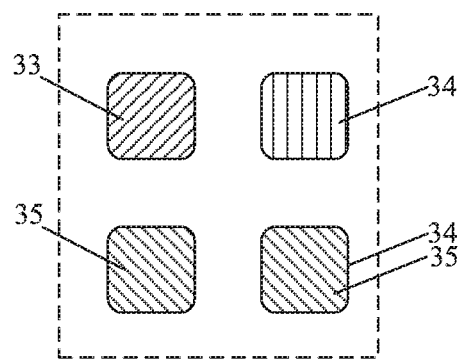
FIG. 14(b) is a schematic diagram showing green light-emitting units formed in regions of green and yellow sub-pixels after evaporation by using the third fine mask plate of FIG. 14(a) on this basis of FIG. 13(b)

In S13, a third color light-emitting layer is formed by evaporation using a third fine mask plate. The third color light-emitting layer includes third color light-emitting units 131 formed in regions of third sub-pixels 13 and fourth sub-pixels 14 of the plurality of pixels 1, respectively. As shown in FIG. 14(a) and FIG. 14(b), the third fine mask plate 70 includes a plurality of third evaporation openings 701, and one third evaporation opening 701 is used to form the third color light-emitting units 131 in the region of the third sub-pixel 13 and the region of the fourth sub-pixel 14 in a corresponding pixel 1.

In some embodiments, on the basis of the red light-emitting units 34 formed in the red sub-pixel R and the yellow sub-pixel Y respectively as shown in FIG. 13(b), green light-emitting units 35 (as shown in FIG. 14(b)) are formed by evaporation using the third fine mask plate 70 as shown in FIG. 14(a) in a region of the green sub-pixel G and a region of the yellow sub-pixel Y respectively. One third evaporation opening 701 of the third fine mask plate 70 is used to form green light-emitting units 35 by evaporation in a region of the green sub-pixel G and a region of the yellow sub-pixel Y of one pixel 1.

Figure 14C:
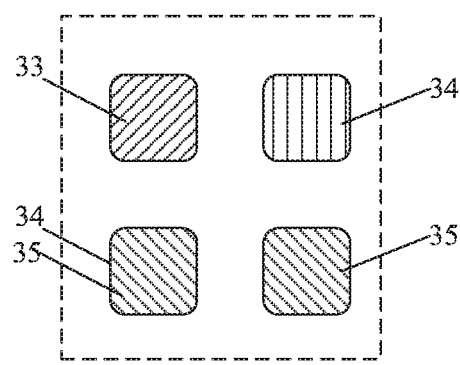
FIG. 14(c) is a schematic diagram showing green light-emitting units formed in regions of green and yellow sub-pixels after evaporation by using the third fine mask plate of FIG. 14(a) on this basis of FIG. 13(d)

In some other embodiments, on the basis of the red light-emitting units 34 formed in the red sub-pixel R and the yellow sub-pixel Y as shown in FIG. 13(d), green light-emitting units 35 (as shown in FIG. 14(c)) are formed by evaporation using the third fine mask plate 70 as shown in FIG. 14(a) in a region of the green sub-pixel G and a region of the yellow sub-pixel Y respectively.

It will be noted that FIG. 14(a)-FIG. 14(c) are merely illustrated for the example of forming the green light-emitting units 35 in a green sub-pixel R and a yellow sub-pixel Y of one pixel 1.

It will be understood by those skilled in the art that in some other embodiments, third color light-emitting units 131 are formed in the region of the third sub-pixel 13 and the region of the fourth sub-pixel 14 through evaporation openings of a fine mask plate, respectively.

In addition, with regard to the order of the forming of the light-emitting layer in the regions of the sub-pixels, it is not limited to the order of S11, S12, and S13, and a specific order may be selected according to actual conditions.

On the basis of the manner that the first sub-pixel 11, the second sub-pixel 12, the third sub-pixel 13, and the fourth sub-pixel 14 are arranged in a 2×2 array, since second color light-emitting units 121 of the second sub-pixel 12 and the fourth sub-pixel 14 of one pixel 1 are formed by evaporation through a second evaporation opening 601 of the second fine mask plate 60, and third color light-emitting units 131 of the third sub-pixel 13 and the fourth sub-pixel 14 are formed by evaporation through a third evaporation opening 701 of the third fine mask plate 70, it is possible to reduce the fabrication process difficulty of the two fine mask plates when the method is applied to high resolution display devices.

In some embodiments, the first electroluminescent device L1, the second electroluminescent device L2, the third electroluminescent device L3 and the fourth electroluminescent device L4 are all top light-emitting type electroluminescent devices.

In the case where the first electroluminescent device L1, the second electroluminescent device L2, the third electroluminescent device L3 and the fourth electroluminescent device L4 are all top light-emitting type electroluminescent devices, each of the electroluminescent devices has obvious micro-cavity effect.

By providing the first electroluminescent device L1, the second electroluminescent device L2, the third electroluminescent device L3 and the fourth electroluminescent device L4 as top light-emitting type electroluminescent devices, the respective electroluminescent devices may be optically adjusted based on the micro-cavity effect.

Especially for the fourth electroluminescent device L4, in the case where the fourth sub-pixel 14 includes the red light-emitting unit and the green light-emitting unit, a new spectrum is obtained by superposing the red light spectrum with the green light spectrum. Due to the micro-cavity effect, the red part and green part in the original spectrum are suppressed, and the yellow part is strengthened. As a result, the fourth sub-pixel 14 emits yellow light.

Based on this, when the fourth sub-pixel 14 emits yellow light due to the micro-cavity effect, it is possible to enhance the capability of yellow performance, broaden the color gamut of the display, and enrich the display color.

In some embodiments, thicknesses of the first electroluminescent device L1, the second electroluminescent device L2, the third electroluminescent device L3 and the fourth electroluminescent device L4 are different.

It will be understood by those skilled in the art that the thickness of each of electroluminescent devices is adjusted for the purpose of modulating the micro-cavity effect, and the purpose of modulating the micro-cavity effect is to modulate the luminescence spectrum to obtain a corresponding color that meets requirements of color purity, color gamut, and the like.

In some embodiments, as shown in FIG. 4 and FIG. 5, the first electroluminescent device L1, the second electroluminescent device L2, the third electroluminescent device L3 and the fourth electroluminescent device L4 all further include a hole transport unit 32. A thickness of each of the first electroluminescent device L1, the second electroluminescent device L2, the third electroluminescent device L3 and the fourth electroluminescent device L4 is adjusted by a thickness of a corresponding hole transport unit 32.

In some embodiments, a thickness of a hole transport unit 32 in the first sub-pixel 11 is a first thickness, a thickness of a hole transport unit 32 in the third sub-pixel 13 is a sum of the first thickness and a second thickness, a thickness of a hole transport unit 32 in the second sub-pixel 12 is a sum of the first thickness, the second thickness and a third thickness, and a thickness of a hole transport unit 32 in the fourth sub-pixel 14 is a sum of the first thickness and the third thickness, so that the thicknesses of the hole transport units 32 of the first sub-pixel 11, the second sub-pixel 12, the third sub-pixel 13 and the fourth sub-pixel 14 are not the same.

On this basis, in some embodiments, the hole transport unit 32 of the first thickness is provided in all sub-pixels. That is, a hole transport layer including all hole transport units 32 of the first thickness completely covers the base.

Figure 15:
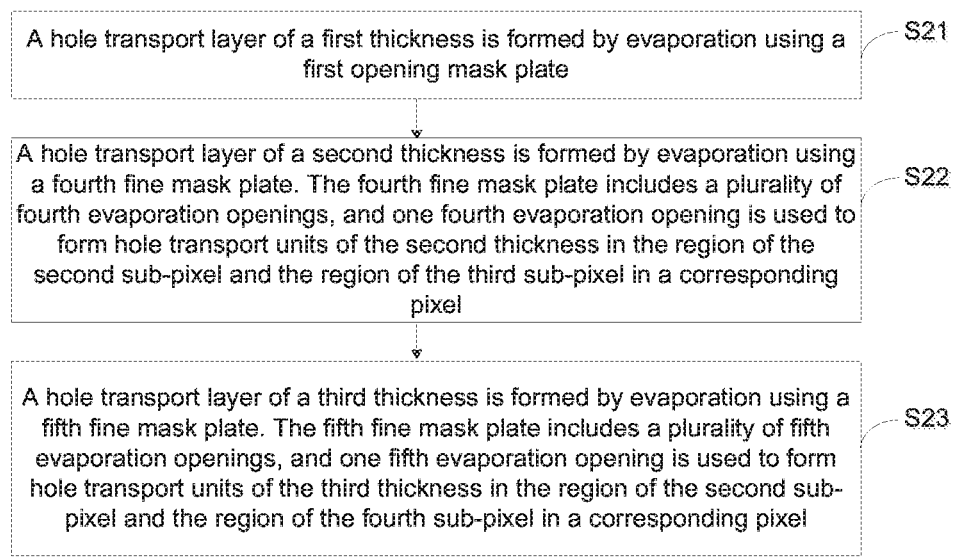
FIG. 15 is a schematic flow diagram of a method for manufacturing hole transport units of different thicknesses in sub-pixels according to some embodiments of the present disclosure.

In some embodiments, the step of forming hole transport units 32 of different thicknesses in a region of the first sub-pixel 11, a region of the second sub-pixel 12, a region of the third sub-pixel 13 and a region of the fourth sub-pixel 14 of each pixel respectively, as shown in FIG. 15, includes steps 21-23 (S21-S23).

In S21, a hole transport layer of a first thickness is formed by evaporation using a first opening mask plate. The hole transport layer of the first thickness includes hole transport units 32 of the first thickness formed in regions of first sub-pixels 11, second sub-pixels 12, third sub-pixels 13 and the fourth sub-pixels 14 of the plurality of pixel 1 respectively.

Figure 16:
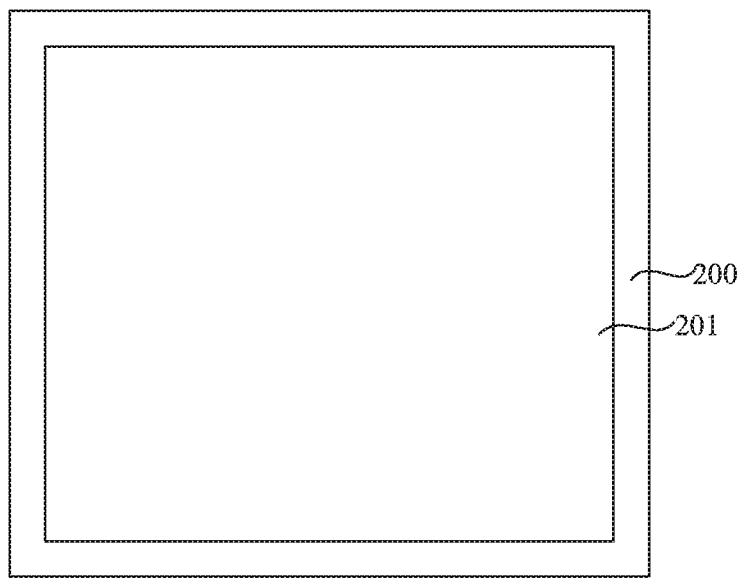
FIG. 16 is a first opening mask plate according to some embodiments of the present disclosure.

That is, as shown in FIG. 16, an opening 201 of the first opening mask plate 200 corresponds to all sub-pixels of the array substrate.

In some embodiments, in the case where the first sub-pixel 11, the second sub-pixel 12, the third sub-pixel 13, and the fourth sub-pixel 14 are respectively the blue sub-pixel B, the red sub-pixel R, the green sub-pixel G, and the yellow sub-pixel Y, a thickness of a hole transport unit 32 in the blue sub-pixel B is less than that of a hole transport unit 32 in the green sub-pixel G, the thickness of the hole transport unit 32 in the green sub-pixel G is less than that of a hole transport unit 32 in the yellow sub-pixel Y, and the thickness of the hole transport unit 32 in the yellow sub-pixel Y is less than that of a hole transport unit 32 in the red sub-pixel R. Based on this, a hole transport layer of a first thickness is formed in regions of all the sub-pixels through the first opening mask plate 200 (shown in FIGS. 6 and 7), and the first thickness will be set according to the requirements of the blue sub-pixel B.

Figure 17A:
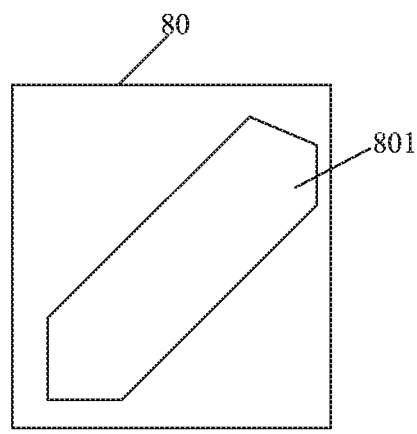
FIG. 17(a) is a schematic diagram of a portion of a fourth fine mask plate according to some embodiments of the present disclosure.

In S22, a hole transport layer of a second thickness is formed by evaporation using a fourth fine mask plate. The hole transport layer of the second thickness includes hole transport units 32 of the second thickness formed in regions of second sub-pixels and third sub-pixels of the plurality of pixel 1 respectively. As shown in FIG. 17(a), the fourth fine mask plate 80 includes a plurality of fourth evaporation openings 801, and one fourth evaporation opening 801 is used to form hole transport units 32 of the second thickness in the region of the second sub-pixel 12 and the region of the third sub-pixel 13 in a corresponding pixel 1.

On the basis of the hole transport unit 32 of the first thickness formed in each of the regions of the sub-pixels, if the four sub-pixels are arranged in the manner as shown in FIG. 3(a), in some embodiments, hole transport units 32 of the second thickness are formed by evaporation using the fourth fine mask plate 80 as shown in FIG. 17(a) in a region of the red sub-pixel R and a region of the green sub-pixel G of each pixel 1. One fourth evaporation opening 801 of the fourth fine mask plate 80 is used for forming hole transport units 32 of the second thickness by evaporation in the region of red sub-pixel R and the region of the green sub-pixel G in one pixel 1 (shown in FIGS. 6 and 7).

In S23, a hole transport layer of a third thickness is formed by evaporation using a fifth fine mask plate. The hole transport layer of the third thickness includes hole transport units of the third thickness formed in regions of second sub-pixels 12 and fourth sub-pixels 14 of the plurality of pixel 1 respectively, so that a thickness of a hole transport unit 32 in the second sub-pixel 12 is a sum of the first thickness, the second thickness and the third thickness, a thickness of a hole transport unit 32 in the fourth sub-pixel 14 is a sum of the first thickness and the third thickness, and a thickness of a hole transport unit 32 in the third sub-pixel 13 is a sum of the first thickness and the second thickness.

Figure 17B:
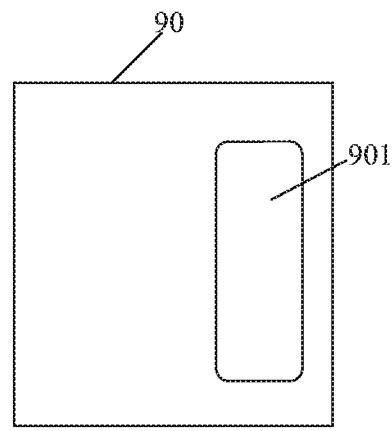
FIG. 17(b) is a schematic diagram of a portion of a fifth fine mask plate according to some embodiments of the present disclosure.

As shown in FIG. 17(b), the fifth fine mask plate 90 includes a plurality of fifth evaporation openings 901, and one fifth evaporation opening 901 is used to form hole transport units 32 of the third thickness in the region of the second sub-pixel 12 and the region of the fourth sub-pixel 14 in a corresponding pixel 1.

On the basis of hole transport units 32 formed in the region of the red sub-pixel R and the region of the green sub-pixel G, in some embodiments, hole transport units 32 of the third thickness are formed by evaporation using the fifth fine mask plate 90 as shown in FIG. 17(b) in a region of the red sub-pixel R and a region of the yellow sub-pixel Y of each pixel 1 respectively. One fifth evaporation opening 901 of the fifth fine mask plate 90 is used for forming hole transport units 32 of the third thickness by evaporation in the region of the red sub-pixel R and the region of the yellow sub-pixel Y in one pixel 1 (shown in FIGS. 6 and 7).

Based on this, a thickness of a hole transport unit 32 in blue sub-pixel B is a first thickness, a thickness of a hole transport unit 32 in the green sub-pixel G is equal to a sum of the first thickness and the second thickness, a thickness of a hole transport unit 32 in the yellow sub-pixel Y is equal to a sum of the first thickness and the third thickness, and a thickness of a hole transport unit 32 in the red sub-pixel R is equal to a sum of the first thickness, the second thickness and the third thickness.

It will be noted that FIG. 17(a)-FIG. 17(b) are merely illustrated for the example of forming the hole transport unit 32 in one pixel 1.

In the embodiments of the present disclosure, although fourth sub-pixels 14 are added, only two fine mask plates are required to form hole transport units 32 of different thicknesses. Therefore, as compared with the circumstance that each of pixels includes three sub-pixels and hole transport units 32 of the three sub-pixels have different thicknesses, in the embodiments of the present disclosure, it is not necessary to increase the number of fine mask plates when the hole transport units 32 of different thicknesses in the first sub-pixel 11, the second sub-pixel 12, the third sub-pixel 13, and the fourth sub-pixel 14 are formed.

In some embodiments, as shown in FIGS. 6 and 7, the first electroluminescent device L1, the second electroluminescent device L2, the third electroluminescent device L3, and the fourth electroluminescent device L4 all further include a hole injection unit 31, an electron transport unit 36, and an electron injection unit 37. A hole injection layer including all hole injection units 31, an electron transport layer including all electron transport units 36, and an electron injection layer including all electron injection units 37 all completely cover the base of the array substrate. Each of the hole injection layer, the electron transport layer, and the electron injection layer is formed by evaporation through a second opening mask plate.

It will be understood that the order of forming units in each of sub-pixels is: the anode 20, the hole injection unit 31, the hole transport unit 32, the light-emitting unit, an electron transport unit 36, an electron injection unit 37, and a cathode 40. Of course, a cathodic protective layer may also be formed over the cathodes 40, and the cathodic protective layer covers the cathodes 40.

In addition, each of sub-pixels may further include a TFT, and the TFT is formed prior to the anode 20.

The foregoing descriptions are merely some embodiments of the present disclosure, but the protection scope of the present disclosure is not limited thereto. Any person skilled in the art could readily conceive of changes or replacement within the technical scope disclosed in the present disclosure, all of which should be included in the protection scope of the present disclosure. Therefore, the protection scope of the present disclosure should be determined by the protection scope of the claims.

What is claimed is:

1. An array substrate comprising a plurality of pixels, each pixel comprising a plurality of sub-pixels, wherein
   the plurality of sub-pixels comprise a first sub-pixel, a second sub-pixel, a third sub-pixel and a fourth sub-pixel;
   the first sub-pixel comprises a first electroluminescent device, and the first electroluminescent device comprises a first color light-emitting unit;
   the second sub-pixel comprises a second electroluminescent device, and the second electroluminescent device comprises a second color light-emitting unit;
   the third sub-pixel comprises a third electroluminescent device, and the third electroluminescent device comprises a third color light-emitting unit;
   the fourth sub-pixel comprises a fourth electroluminescent device, and a light-emitting unit of the fourth electroluminescent device is formed of a combination of light-emitting materials that are used for forming the second color light-emitting unit and the third color light-emitting unit respectively;
   the first electroluminescent device, the second electroluminescent device, the third electroluminescent device and the fourth electroluminescent device all further comprise hole transport units;
   a thickness of a first hole transport unit in the first sub-pixel is a first thickness, a thickness of a third hole transport unit in the third sub-pixel is a sum of the first thickness and a second thickness, a thickness of a second hole transport unit in the second sub-pixel is a sum of the first thickness, the second thickness and a third thickness, and a thickness of a fourth hole transport unit in the fourth sub-pixel is a sum of the first thickness and the third thickness;
   a first hole transport layer of the first thickness is provided in all sub-pixels; and
   the first color light-emitting unit, the second color light-emitting unit, the third color light-emitting unit and the light-emitting unit of the fourth electroluminescent device are spaced apart from each other.

2. The array substrate according to claim 1, wherein the fourth electroluminescent device comprises the second color light-emitting unit and third color light-emitting unit that are stacked one on another.

3. The array substrate according to claim 1, wherein the first color light-emitting unit is configured to emit light of a blue color, the second color light-emitting unit is configured to emit light of a red color, and the third color light-emitting unit is configured to emit light of a green color.

4. The array substrate according to claim 1, wherein the first sub-pixel, the second sub-pixel, the third sub-pixel, and the fourth sub-pixel are arranged in a 2×2 array;
   among four sub-pixels that are composed of the first sub-pixel, the second sub-pixel, the third sub-pixel, and the fourth sub-pixel, any two sub-pixels are adjacently disposed in an i-th row, and another two sub-pixels are adjacently disposed in an i+1th row; where i is a positive integer.

5. The array substrate according to claim 1, wherein the fourth electroluminescent device is a top light-emitting type electroluminescent device.

6. The array substrate according to claim 5, wherein the first electroluminescent device, the second electroluminescent device and the third electroluminescent device are all top light-emitting type electroluminescent devices.

7. The array substrate according to claim 6, wherein thicknesses of the first electroluminescent device, the second electroluminescent device, the third electroluminescent device and the fourth electroluminescent device are different.

8. A display device, comprising the array substrate according to claim 1.

9. A method for manufacturing the array substrate according to claim 1, the array substrate comprising the plurality of pixels, each pixel comprising the plurality of sub-pixels, the plurality of sub-pixels comprise the first sub-pixel, the second sub-pixel, the third sub-pixel and the fourth sub-pixel, and the method comprising:
   forming the first electroluminescent device in a region of the first sub-pixel of each pixel, the first electroluminescent device comprising [the first color light-emitting unit;
   forming the second electroluminescent device in a region of the second sub-pixel of each pixel, the second electroluminescent device comprising the second color light-emitting unit;
   forming the third electroluminescent device in a region of the third sub-pixel of each pixel, the third electroluminescent device comprising the third color light-emitting unit; and
   forming the fourth electroluminescent device in a region of the fourth sub-pixel of each pixel, the fourth electroluminescent device comprising the second color light-emitting unit and third color light-emitting unit that are stacked one on another;
   forming the first hole transport layer of the first thickness by evaporation using a first opening mask plate in the regions of first sub-pixels, second sub-pixels, third sub-pixels and fourth sub-pixels of the plurality of pixels respectively;
   forming a second hole transport layer of the second thickness by evaporation using a fourth fine mask plate in the regions of the second sub-pixels and the third sub-pixels of the plurality of pixels respectively, wherein the fourth fine mask plate comprises a plurality of fourth evaporation openings, and one fourth evaporation opening is used to form second hole transport layers of the second thickness in the region of the second sub-pixel and the region of the third sub-pixel in a corresponding pixel;
   forming a third hole transport layer of the third thickness by evaporation using a fifth fine mask plate in the regions of the second sub-pixels and the fourth sub-pixels of the plurality of pixels respectively, so that the thickness of the second hole transport unit in the second sub-pixel is the sum of the first thickness, the second thickness and the third thickness, the thickness of the fourth hole transport unit in the fourth sub-pixel is the sum of the first thickness and the third thickness, and the thickness of the third hole transport unit in the third sub-pixel is the sum of the first thickness and the second thickness, wherein the fifth fine mask plate comprises a plurality of fifth evaporation openings, and one fifth evaporation opening is used to form third hole transport layers of the third thickness in the region of the second sub-pixel and the region of the fourth sub-pixel in a corresponding pixel; and
   the first color light-emitting unit, the second color light-emitting unit, the third color light-emitting unit and the light-emitting unit of the fourth electroluminescent device are spaced apart from each other.

10. The method for manufacturing the array substrate according to claim 9, wherein the first color light-emitting unit is formed to emit light of a blue color, the second color light-emitting unit is formed to emit light of a red color, and the third color light-emitting unit is formed to emit light of a green color.

11. The method for manufacturing the array substrate according to claim 9, wherein the first sub-pixel, the second sub-pixel, the third sub-pixel, and the fourth sub-pixel are arranged in a 2×2 array;
   forming the first color light-emitting unit in the region of the first sub-pixel of each pixel, forming the second color light-emitting unit in the region of the second sub-pixel of each pixel, forming the third color light-emitting unit in the region of the third sub-pixel of each pixel, and forming the second color light-emitting unit and the third color light-emitting unit that are stacked one on another in the region of the fourth sub-pixel of each pixel, comprise:
   forming a first color light-emitting layer by evaporation using a first fine mask plate, the first color light-emitting layer comprising first color light-emitting units formed in regions of first sub-pixels of the plurality of pixels respectively;
   forming a second color light-emitting layer by evaporation using a second fine mask plate, the second color light-emitting layer comprising second color light-emitting units formed in regions of second sub-pixels and fourth sub-pixels of the plurality of pixels respectively, wherein the second fine mask plate comprises a plurality of second evaporation openings, and one second evaporation opening is used to form second color light-emitting units in the region of the second sub-pixel and the region of the fourth sub-pixel in a corresponding pixel; and
   forming a third color light-emitting layer by evaporation using a third fine mask plate, the third color light-emitting layer comprising third color light-emitting units in regions of third sub-pixels and fourth sub-pixels of the plurality of pixels respectively, wherein the third fine mask plate comprises a plurality of third evaporation openings, and one third evaporation opening is used to form third color light-emitting units in the region of the third sub-pixel and the region of the fourth sub-pixel in a corresponding pixel.

12. The method for manufacturing the array substrate according to claim 9, wherein the first electroluminescent device, the second electroluminescent device, the third electroluminescent device and the fourth electroluminescent device are all top light-emitting type electroluminescent devices.

* * * * *